United States Patent [19]

Zasio

[11] 4,189,230
[45] Feb. 19, 1980

[54] WAFER HOLDER WITH SPRING-LOADED WAFER-HOLDING MEANS

[75] Inventor: Gabriel Zasio, Los Altos, Calif.

[73] Assignee: Fujitsu Limited, Kawasaki, Japan

[21] Appl. No.: 845,496

[22] Filed: Oct. 26, 1977

[51] Int. Cl.² ............ G01N 21/30; G03B 27/02; G03B 27/62; H01L 21/68

[52] U.S. Cl. .................. 355/76; 269/321 WE; 355/53; 355/132

[58] Field of Search ...... 269/321 A, 321 W, 321 WE; 355/72, 76, 53, 95, 125, 132, 133

[56] References Cited

U.S. PATENT DOCUMENTS

| | | | |
|---|---|---|---|
| 3,569,718 | 3/1971 | Borner | 355/53 X |
| 3,577,682 | 5/1971 | Kulischenko | 269/321 WE UX |
| 3,645,622 | 2/1972 | Cachon et al. | 355/132 |
| 4,093,378 | 6/1978 | Horr et al. | 355/53 X |

FOREIGN PATENT DOCUMENTS 2431507 1/1976 Fed. Rep. of Germany ... 269/321 WE

OTHER PUBLICATIONS

I.B.M. Technical Disclosure Bulletin, vol. 17, No. 12, May 1975, p. 3577, Wafer Positioner Caccoma et al.

Primary Examiner—Donald A. Griffin
Attorney, Agent, or Firm—David E. Lovejoy

[57] ABSTRACT

A semiconductor wafer holder, for use in discharge and other processing apparatus, comprised of a non-magnetic frame having an opening defined by an inner wall for receiving a wafer. A non-magnetic circular flange extends out from the frame body over the inner wall forming a bottom surface extending partially into the opening. The bottom surface acts as a mechanical stop for the top surface of a wafer forced up into the opening by a spring-loaded bottom plate. A spring-loaded plunger mechanism extends through a hole in the frame and inner wall into the opening to contact the side edge of a wafer in the opening and forces the wafer into contact with side-edge mechanical stops.

17 Claims, 11 Drawing Figures

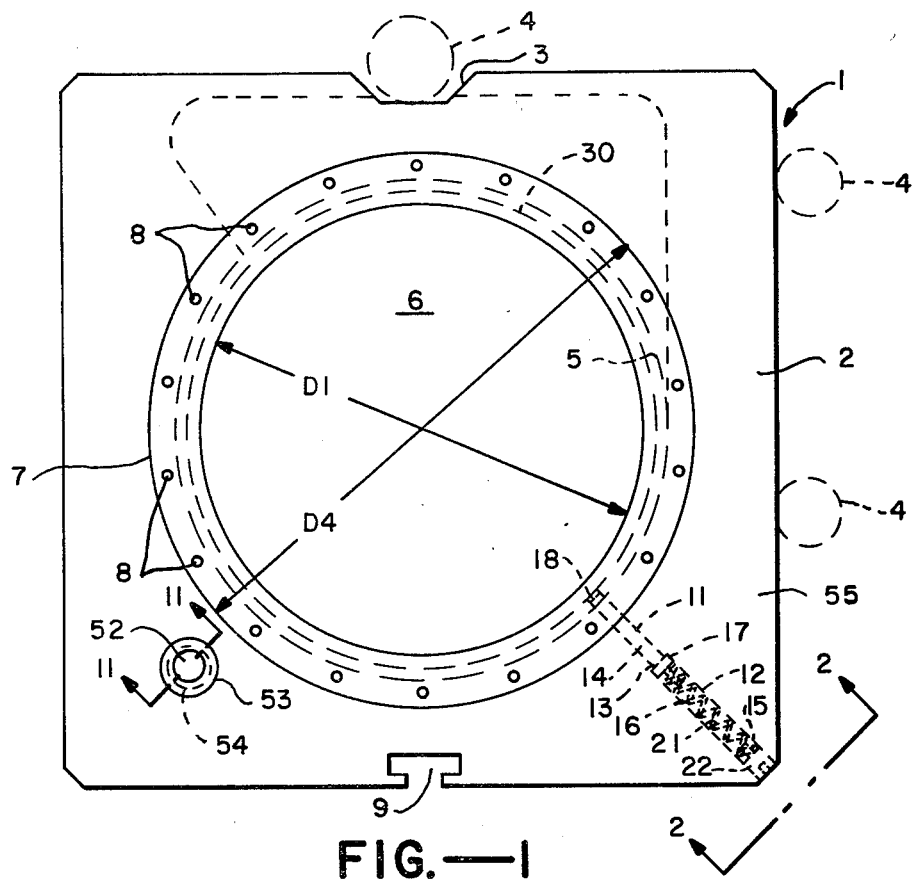
FIG.—1
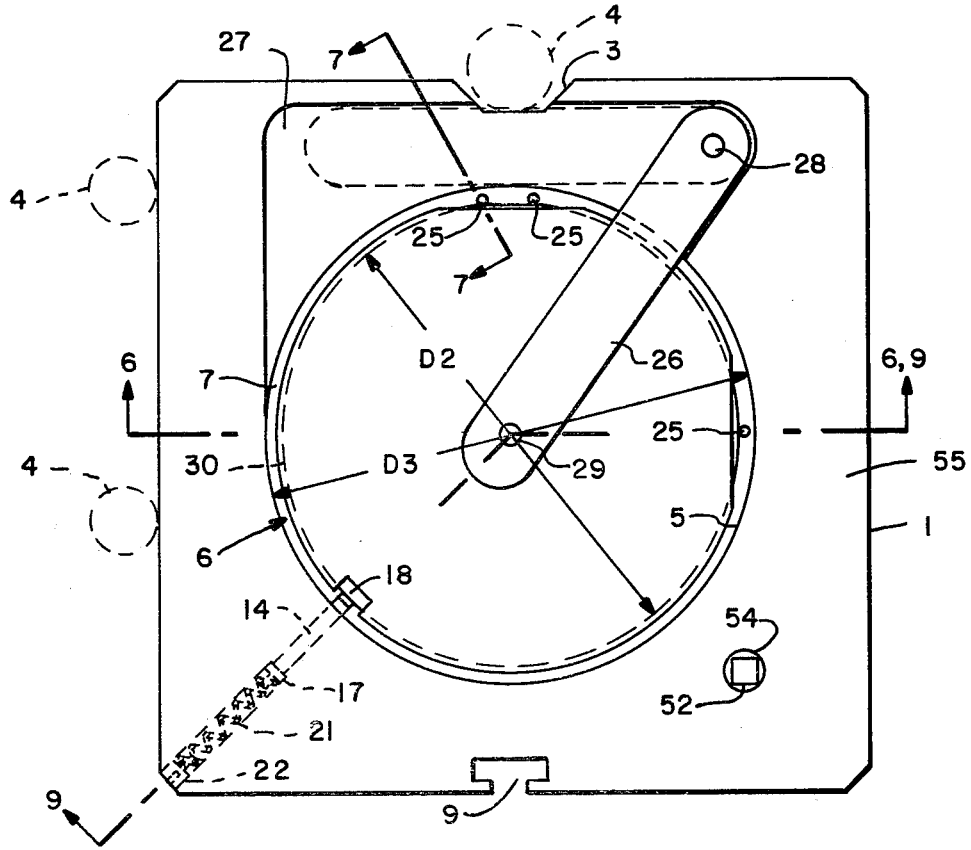
FIG.—5

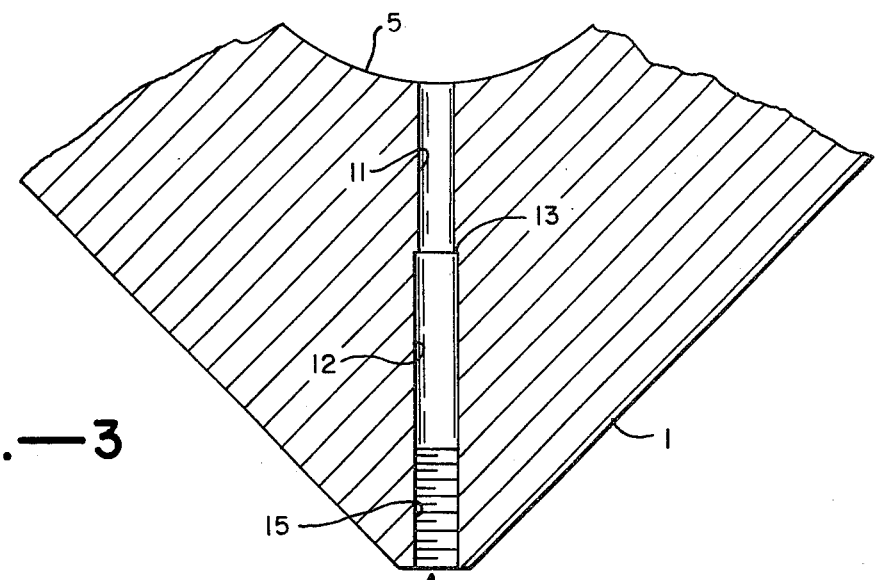
FIG.—3
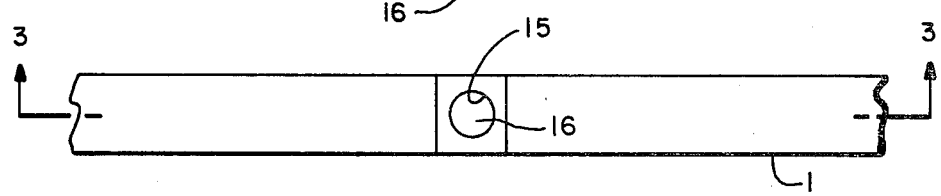
FIG.—2
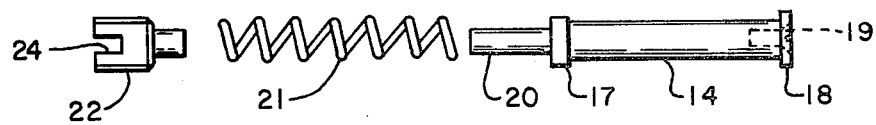
FIG.—4
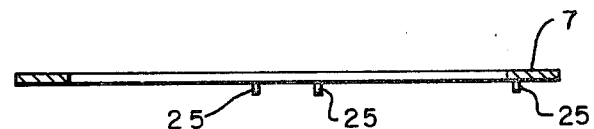
FIG.—6
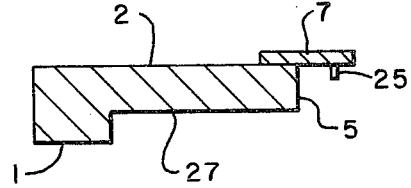
FIG.—7

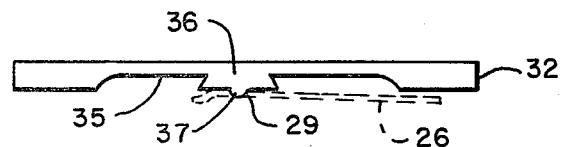
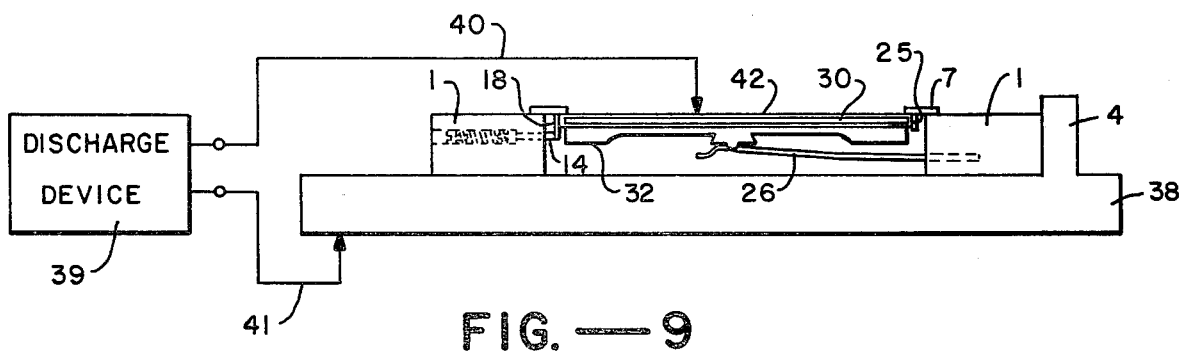
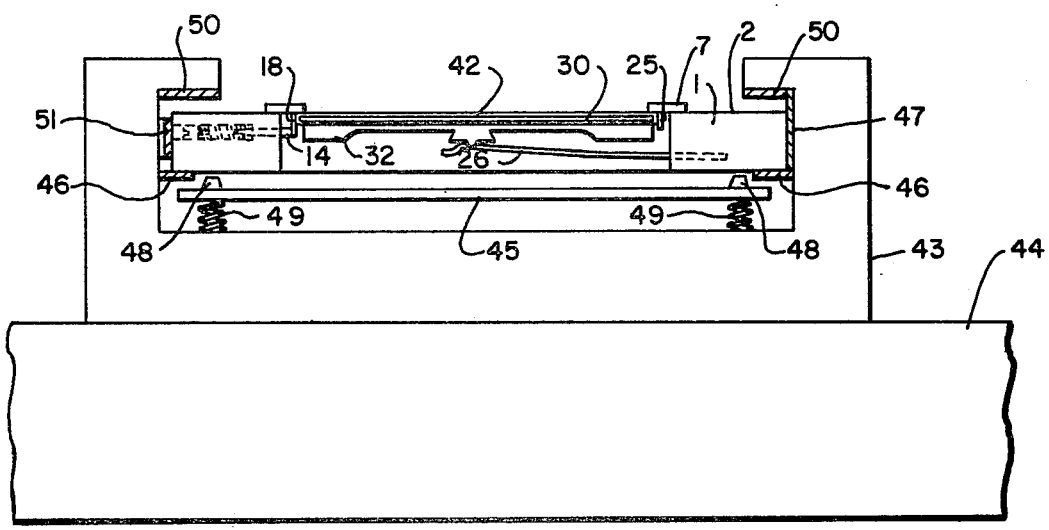
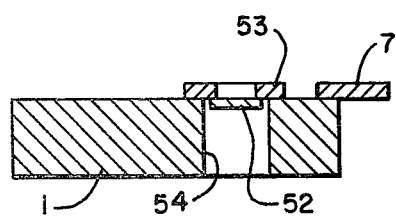

WAFER HOLDER WITH SPRING-LOADED WAFER-HOLDING MEANS

CROSS REFERENCE TO RELATED APPLICATIONS

DISCHARGE DEVICE AND METHOD FOR USE IN PROCESSING SEMICONDUCTOR DEVICES, Ser. No. 840,674, filed Oct. 11, 1977, invented by John J. Zasio and Michael W. Samuels, and assigned to the assignee of the present invention.

AN ION IMPLANTATION METHOD, Ser. No. 840,793, filed Oct. 11, 1977, invented by Gregorio Spadea, and assigned to the assignee of the present invention.

BACKGROUND OF THE INVENTION

The present invention relates to wafer holders and more particularly to wafer holders suitable for use in semiconductor wafer processing such as the electron beam exposure of wafers.

Semiconductor processing requires the wafer to undergo many different steps such as oxidation, gaseous deposition, ion implantation, metal deposition, electron beam exposure and gaseous etching. These steps are carried out by using a wafer holder suitable for each step.

The electron beam processing step is one which is usually more accurate than other types of photolithograph. In a typical example of electron beam processing, the wafer is comprised of doped silicon covered by an insulating layer. The wafer surface is coated with an electron beam resist. The wafer is mounted in a wafer holder and placed in an electron beam exposure system.

In a typical exposure system, the wafer in a holder is placed on a table movable in X- and Y- axes directions with the aid of servomotors. The servomotors are controlled by a computer.

The scanning area of the electron beam typically is restricted to a movement of 0.5 millimeters and thus the movement is much smaller than the typical chip area. In such an environment, it is necessary to rigidly hold the wafer and wafer holder relative to the moving table.

Several techniques have been utilized to hold the wafer holder and the wafer. One technique employs a magnetic chuck in which a magnetic metal holder is rigidly held by a magnetic field. This method is not desirable, however, because the magnetic field affects the position of the otherwise accurately positioned electron beam. Another technique employs a vacuum chuck in which the wafer and wafer holder are held in place by a vacuum. This vacuum technique, however, is not readily useable in electron beam systems since the work chamber in the electron beam system itself must be maintained as a vacuum. Because of the problems of magnetic and vacuum techniques, mechanical techniques are more desirable.

While a holder having a leaf spring for holding the wafer against mechanical stops on the wafer holder has been attempted, some difficulties have arisen from this and other mechanical techniques. For instance, relatively small sized wafers were too loose so that the wafers either moved or fell out of the wafer holder. On the other hand, if the spring force was increased to hold the wafers, relatively large-sized wafers tended to have broken edges as a result of the spring force.

In view of the above background, an object of the present invention is to provide an improved mechanical wafer holder which holds the wafer rigidly without damage and is suitable for use in electron beam and other apparatus employed to process semiconductors.

Another object of the present invention is to provide a wafer holder capable of sustaining the wafer rigidly.

Additional objects and features of the invention will appear from the following description in which the preferred embodiments of the invention have been set forth in detail in conjunction with the drawings.

BRIEF DESCRIPTION OF THE DRAWINGS

FIG. 1 depicts a top view of a wafer holder in accordance with the present invention.

FIG. 2 is a front view of one corner part of the holder of FIG. 1 having an opening for receiving a spring-loaded plunger.

FIG. 3 depicts a partial cross-sectional view of the spring-loaded plunger opening of FIG. 2.

FIG. 4 depicts a spring-loaded plunger assembly for use in the opening of FIGS. 2 and 3.

FIG. 5 depicts a bottom view of the wafer holder of FIG. 1.

FIG. 6 depicts a cross-sectional view of a flange forming part of the FIG. 1 holder.

FIG. 7 depicts a partial cross-sectional view of the flange and frame of the FIG. 1 holder.

FIG. 8 depicts a partial cross-sectional view of the back plate.

FIG. 9 depicts a partially schematic electrical and mechanical representation of an apparatus in accordance with the present invention.

FIG. 10 depicts a partially schematic mechanical representation of a holder fixture on a movable table in accordance with the present invention.

FIG. 11 depicts a partial cross-sectional view of an alignment element secured on the holder of FIG. 1.

DETAILED DESCRIPTION OF THE INVENTION

In FIG. 1, a top view of a wafer holder 1 is shown. The wafer holder 1 is typically formed of a non-magnetic frame 55 such as a non-magnetic stainless steel. A non-magnetic material is required to avoid any influence on the electron beam when the holder is used in an electron beam exposure apparatus. The frame 55 of the wafer holder 1 has a finished top surface 2 with a flatness of approximately $\pm 5 \times 10^{-6}$ meters. In one embodiment, the frame 55 of the holder has a thickness of 6.35 millimeters. The holder 1 includes a notch 3 in on side which is designed to be forced against a post 4. The post 4 (which is not part of the holder 1) functions as a mechanical stop for one edge of the holder 1. Two additional posts 4 (not part of holder 1) function to serve as mechanical stops for another edge of the holder 1. These posts 4 are rigidly located on any base plate such as shown in FIG. 9. The holder 1 is provided with a groove 9 which is engaged when the holder 1 is used on a movable table fixture.

The frame 55 has an inner wall 5 which defines an opening 6. On the top surface 2 of the frame 55, a flange 7 extends from the surface 2 over the wall 5 into a portion of the opening 6. The flange 7 is secured on the top surface 2 of the frame 5 by a number of small screws 8. The flange 7 provides a mechanical stop for a wafer to be inserted from the bottom of the opening 6 up against the bottom surface of the flange 7. The flange 7 is also made of the non-magnetic material such as phosphorous bronze.

The frame 55 has a hole 16 extending from an outer corner to the inner wall 5 of the holder 1. The hole 16 includes three portions 11, 12, and 13. The portion 11 has a relatively small diameter at the inner wall side. The second portion 12 has a relatively large diameter with a wall 13 where the portions 11 and 12 meet. The wall 13 provides a mechanical stop for the end 18 of a plunger 14 which is shown in more detail in FIG. 5. The last portion 15 is threaded to receive an adjustment screw 22.

FIGS. 2 and 3 show further details of the arrangement of the three portions 11, 12 and 13. FIG. 2 is a front view of the corner of the holder 1, showing the hole 16 and the thread 15.

FIG. 3 is a cross-sectional view of the corner of the holder 1 taken along the section lines 2—2 in FIG. 2.

In FIG. 4, the spring-loaded plunger assembly is shown. The assembly includes a plunger 14 with a flange 17 formed at the one end. A front plate 18 is attached at the other end of the plunger 14 by a bolt 19. The front plate 18 is attached to plunger 14 after the insertion of the plunger 14 into the portion 11 through the second and third portions 12 and 15 of hole 16.

The plunger 14 is also provided with protrusion 20 which extends into and secures one end of a coil spring 21.

The plunger assembly includes a dog leg set screw 22 which has a protrusion 23 which extends into and secures the other end of coil spring 21 and has a recess 24 for turning the screw 22 in the threads 15 to adjust the spring compression.

For assembly, the plunger 14 is inserted into the portion 11, the spring 21 is positioned approximately at the portion 12 and then the set screw 22 is engaged with threads 15. Thereafter, the front plate 18 is secured at the end of the plunger 14.

The flange 17 abuts against the mechanical stop 13 by the operation of the spring 21 under the condition that the wafer 30 is not placed in the wafer holder 1.

The compression of the spring 21 is readily controlled by turning and by moving the position of set screw 22 back and forth.

In FIG. 5, a bottom view of the holder 1 of FIG. 1 is shown. Mechanical stops 25 are rigidily connected to the flange 7 and serve to laterally position the wafer 30 in cooperation with spring-loaded plunger 14. An additional stop 25, also connected to the flange 7, is located approximately 90° from the stops 25. The leaf spring 26 is pivotally connected to the holder 1 by screw 28 for positioning the wafer 30 in the vertical direction.

FIG. 6 shows a front view of the flange 7 and mechanical stops 25 taken along section line 6—6 of FIG. 5. The stops 25 extend downwardly from the bottom surface of flange 7.

FIG. 7 shows a partial sectional view of the holder 1 taken along the section line 7—7 line in FIG. 5. In FIG. 7, the flange 7 contacts the top surface 2 of the holder 1 and the mechanical stop 25 is offset from the inner wall 5 and extends downward from the bottom surface of flange 7. The recess 27 is provided in the holder 1.

In FIG. 5, a flat spring 26 is pivotally connected to the holder 1 by a screw 28. The spring 26 is rotatable around the screw 28 toward the notch 3 and into the recess 27. With the spring 26 rotated to the phantom position (shown by broken line), the wafer may be easily inserted into or removed from the opening 6. The spring 26 has a hole 29 at one end for securing a bottom plate as shown in FIGS. 8, 9 and 10.

FIG. 8 shows a cross-sectional view of the back plate 32 and the manner by which it is engaged by the spring 26. The back plate 32 is typically comprised of a non-magnetic metal such as aluminum and has a circular recess 35 to create a protrusion 36 which is readily grasped either by hand or instrument. A small projection 37 extends from the protrusion 36. The spring 26 is set on the protrusion 36 in contact with the projection 37 in such a manner that the projection 37 is inserted into the hole 29 of the spring 26.

In FIGS. 1 and 5, the wafer 30 typically has a diameter $D_3$ which measures approximately 7.5 centimeters. The wafer diameter $D_3$ is somewhat smaller than the diameter $D_2$ of the opening 6 to provide clearance between the wafer 30 and wall 5. In semiconductor technology, the wafer 30 is typically silicon. The wafer 30 is usually covered by insulating layers such as silicon dioxide and silicon nitride. The wafer is normally processed by cutting to form an edge 31 along the crystalline plane of the silicon having an orientation 100.

To place the wafer 30 in the opening 6, the front plate 18 is pressed by any instrument against the compression of the spring 21. With the spring 21 thus compressed, the wafer is placed against the flange 7. The front plate 18 is released against the edge 31 of the wafer 30 and the wafer 30 becomes forced against the stops 25. The front plate 18 against the wafer edge is pressure loaded with a pressure controlled by the set screw 22 setting for the spring-loaded plunger assembly. The capability of increasing or decreasing the pressure as needed insures that the holder will accomodate under and over size wafers without causing the wafer edge to break.

When the wafer 30 is held in the opening 6, the back plate 32 contacts the wafer 30 as shown in FIG. 5. The back plate 32 is slightly larger in diameter than the wafer 30 and has two edges 33 to provide clearance for wafer contact with stops 25 and has a recess 34 to avoid interference with the spring-loaded plunger 14.

The wafer holder 1 is used in different semiconductor processing steps such as discharge steps and electron beam exposure steps.

The discharge step creates a conductive channel in an insulating layer covering a silicon wafer or other conductive body. The conductive channel provides a relatively low impedance path for conducting away electrons to be accumulated in the body during the electron beam exposure process. A high voltage energy discharge in a discharge device is applied between the wafer and the wafer holder to cause the conductive channel to be formed. A discharge apparatus is shown in FIG. 9.

In FIG. 9, the wafer holder 1 holds a wafer 30 in accordance with the present invention on a metal bottom plate 38. The post 4 on the plate 38 serves as a mechanical stop for the holder 1. The notch 3 of the holder 1 is abutted against another post (not shown).

The discharge device 39 is connected by one lead 40 to a probe (not shown) which contacts the surface of the silicon wafer 30. The discharge device 39 is connected by a second lead 41 to the conductive holder 1.

The surface of the silicon wafer 30 is typically covered by a silicon dioxide over its whole surface and an electron beam resist typically on its top surface for electron beam exposure. For purposes of simplicity, in FIG. 9 these surface layers are depicted as a single insulating layer.

In FIG. 9, the discharge device 39 is any electrical device which has sufficient voltage and energy to force a current through the insulating layer 42 to form an electrical connection through the insulating layer 42 to the conductive silicon body. For typical silicon dioxide layers utilized in present day semiconductor processing, voltages ranging from 2,000 volts to 20,000 volts are usually required to form the electrical connection. The existence of the desired electrical connection is established by measuring the resistance between the holder 1 from line 41 to the surface of the wafer 30 at line 40. Before the electrical discharge, the resistance through the holder 10 and the wafer 30 between lines 40 and 41 is more than 100 times $10^6$ ohms. After an electrical discharge from the discharge device 39, electrical resistance is less than 1 times $10^6$ ohms and usually in the order of between 10,000 and 50,000 ohms. The establishment of the electrical connection as evidence by the substantial reduction in resistance, is dependent upon driving sufficient current through the insulating layer. While the exact nature of the phenomenon is not fully understood, it appears that this electrical discharge from the discharge device 39 with sufficient voltage causes an arcing between the conductive silicon across the insulating layer 42 to the conductive line 40 on one side, and to the metal holder 1, connected to the line 41 on the other side.

The electron beam exposure process is a process for exposing an electron beam resist with high accuracy.

As shown in FIG. 10, the wafer holder 1 after the discharge steps in FIG. 9 is placed in a mounting fixture 43 secured on the table 44 of FIG. 10. The table 44 is controlled to position the wafer 30 at any desired location in the work chamber of an electron beam column (not shown).

In order to insert the holder 1 into the fixture 43, the holder 1 is placed on a lower edge 46 and pushed. During the insertion of the holder 1, the right hand side of the holder is forced in contact with a slide wall by the compression of a spring 51. The slide wall 47 is made of a smooth plastic (such as Teflon) to facilitate a smooth insertion. The notch 3 of the holder 1 (see FIG. 1) is abutted against the mechanical stop 4 (see FIG. 1) which is secured to the fixture 43 (not shown in FIG. 10). The pressure plate 45 with four buttons 48 spring-loaded with four coil springs 49 (only two shown in FIG. 10) force the holder 1 up against the upper surfaces 50. In FIG. 10, plate 45 is shown forced into a retracted position (by manual or other means not shown) so that holder 1 is not yet forced up against surfaces 50. The surfaces 50 and also edges 46 are non-magnetic material such as phosphorous bronze.

An electron beam focused on a wafer surface is adjusted with the aid of a V-groove formed on a surface. The adjustment is more accurate if the V-groove does not have any overlying layers. FIG. 11 shows an enlarged cross-sectional view of holder 1 taken along section line 11—11 of FIG. 1.

As shown in FIG. 11, the wafer holder of the present invention is provided with an alignment element 52 having such a V-groove thereon. The alignment element 52 is typically a silicon chip having an orientation of 100. The element 52 is cemented with its upper surface against the bottom surface of a small flange 53. A hole 54 is provided in the holder 1 providing side clearance for the element 52.

The alignment element 52 has its upper surface level with the upper surface of wafer 30 in order that the focal distance (from the electron beam source, not shown) for both the wafer 30 and the element 52 coincide.

The adjustment of the electron beam using alignment element 52 is carried out operating the electron beam apparatus as a scanning electron microscope. The V-groove on the element 52 is displayed by the microscope.

The adjustment of the electron beam is executed in terms of the beam field rotation, the beam X and Y axes deflecting circuit gains and the perpendicularity of the electron beam scan in the X and Y axes directions.

As to the field rotation, the orientation of the X and Y scan axes of electron beam is aligned (typically made orthogonal or parallel) to the orientation of the wafer. To make an adjustment, the deflection coils are manually rotated or the magnetic field is electrically adjusted.

The X and Y gains are typically adjusted by controlling the gains of amplifiers in the deflection circuits.

The perpendicularity of the X and Y axes is also adjusted by controlling gains of amplifiers in the deflection circuits in conjunction with adjustment to X and Y gains.

The electron beam exposure system thus adjusted and employing the holder of the present invention is capable of scanning an electron beam over an area of 500 micrometers square with high positional accuracy.

While the invention has been particularly shown and described with reference to the preferred embodiments thereof, it will be understood by those skilled in the art that those changes in form and details may be made therein without departing from the spirit and the scope of the invention.

What is claimed is:

1. A wafer holder for holding a wafer with an upper surface of the wafer exposed, comprising,
    a frame having an opening defined by an inner wall for receiving said wafer,
    a flange extending from said inner wall into a portion of said opening and having a bottom surface for receiving the upper surface of said wafer,
    stop means secured in a fixed position relative to said flange and extending into said opening,
    first forcing means forcibly extending from said frame to force said wafer into contact with said stop means, whereby said wafer is rigidly held by said holder.

2. The wafer holder of claim 1 wherein said frame, flange and first forcing means are made of non-magnetic material.

3. The wafer holder of claim 1 wherein said stop means includes a plurality of pins rigidly extending from said bottom surface of said flange.

4. The wafer holder of claim 3 wherein said pins include two pins positioned to contact an orientation edge of said wafer and a third pin spaced from said two pins to contact an edge of said wafer, said pins being generally on the opposite side of said opening as said first forcing means.

5. The wafer holder of claim 1 further including an alignment means spaced from said opening and attached to said frame.

6. The wafer holder of claim 5 wherein said alignment means includes a semiconductor wafer having a V-groove.

7. The wafer holder of claim 1 further comprising an alignment element secured on said frame for accurate positioning of said holder.

8. A wafer holder for holding a wafer with an upper surface of the wafer exposed, comprising,
a frame having an opening defined by an inner wall for receiving said wafer,
a flange extending from said inner wall into a portion of said opening and having a bottom surface for receiving the upper surface of said wafer,
stop means secured in a fixed position relative to said flange and extending into said opening,
first forcing means forcibly extending from said frame to force said wafer into contact with said stop means, whereby said wafer is rigidly held by said holder,
a back plate for backing said wafer, and
second forcing means for forcing said back plate up into said opening to force said upper surface into contact with said bottom surface of said flange.

9. The wafer holder of claim 8 wherein said second forcing means is a plate spring connected to said frame structure for forcing said back plate toward said bottom surface of said flange.

10. A wafer holder comprising,
a frame structure having an opening for attaching said wafer and having a hole extending from the frame side to an inner wall defining said opening therein,
a flange portion extending from an edge of said opening over said inner wall,
mechanical stop means secured on said flange portion for abutting said wafer, said stop means protruding inside of said opening,
plunger means provided in said hole for compressing said wafer end so as to contact with said stop means,
spring means inserted in said hole for providing a compression force to said plunger means, and
means attached to said spring means for controlling the magnitude of said compression force.

11. A wafer holder for use in electron beam lithography, comprising,
a non-magnetic frame having a substantially flat upper surface and an opening defined by an inner wall,
a wafer positioned in said frame, said wafer being covered with an insulating layer and an electron beam resist overlaid thereon,
a non-magnetic flange extending from said inner wall into a portion of said opening and having a bottom surface for receiving the upper surface of said wafer,
stop means secured in a fixed position relative to said flange and extending into said opening,
a non-magnetic first forcing means forcibly extending from said frame to force said wafer into contact with said stop means, whereby said wafer is rigidly held by said holder.

12. The wafer holder of claim 11 wherein said non-magnetic frame is metallic.

13. The wafer holder of claim 12 wherein said non-magnetic, metallic frame is electrically connected to said wafer by a conductive channel extending through said insulating layer and said electron beam resist.

14. The wafer holder of claim 13 wherein said frame is electrically connected to said wafer with a series resistance below one times $10^6$ ohms.

15. A wafer holder for use in electron beam lithography, comprising,
a frame having a substantially flat upper surface and an opening defined by an inner wall,
a wafer positioned in said frame, said wafer being covered with an electron beam resist,
a flange extending from said inner wall into a portion of said opening and having a bottom surface for receiving the upper surface of said wafer,
stop means secured in a fixed position relative to said flange and extending into said opening,
first forcing means forcibly extending from said frame to force said wafer into contact with said stop means,
an alignment element secured on said frame, said alignment element having a surface level with said upper surface of said wafer.

16. The wafer holder of claim 15 wherein said alignment element has a mark for adjusting the electron beam.

17. A wafer holder for holding a wafer with an upper surface of the wafer exposed, comprising,
a frame having a substantially flat upper surface and an opening defined by an inner wall for receiving said wafer,
a flange extending from said inner wall into a portion of said opening and having a bottom surface for receiving the upper surface of said wafer, said bottom surface being parallel with said substantially flat upper surface,
stop means secured in a fixed position relative to said flange and extending into said opening,
first forcing means forcibly extending from said frame to force said wafer into contact with said stop means, whereby said wafer is rigidly held by said holder.

* * * * *